(12) United States Patent
Sakamoto et al.

(10) Patent No.: US 10,186,486 B2
(45) Date of Patent: Jan. 22, 2019

(54) WIRING BOARD

(71) Applicant: IBIDEN CO., LTD., Ogaki (JP)

(72) Inventors: Hajime Sakamoto, Ogaki (JP);
Keisuke Shimizu, Ogaki (JP)

(73) Assignee: IBIDEN CO., LTD., Ogaki (JP)

( * ) Notice: Subject to any disclaimer, the term of this patent is extended or adjusted under 35 U.S.C. 154(b) by 0 days.

(21) Appl. No.: 15/661,177

(22) Filed: Jul. 27, 2017

(65) Prior Publication Data

US 2018/0033732 A1 Feb. 1, 2018

(30) Foreign Application Priority Data

Jul. 27, 2016 (JP) ................. 2016-147556

(51) Int. Cl.

| H01L 23/52 | (2006.01) |
|---|---|
| H01L 23/28 | (2006.01) |
| H01L 23/538 | (2006.01) |
| H01L 21/48 | (2006.01) |
| H01L 23/498 | (2006.01) |

(52) U.S. Cl.
CPC ........ *H01L 23/5383* (2013.01); *H01L 21/486* (2013.01); *H01L 21/4857* (2013.01); *H01L 23/5384* (2013.01); *H01L 23/5386* (2013.01); *H01L 23/5389* (2013.01); *H01L 23/49811* (2013.01)

(58) Field of Classification Search
CPC ............. H01L 23/5383; H01L 21/4857; H01L 21/486; H01L 23/5384; H01L 23/5386; H01L 23/5389
USPC .............................................. 257/774, 787
See application file for complete search history.

(56) References Cited

U.S. PATENT DOCUMENTS

| 7,285,862 | B2 * | 10/2007 | Sunohara | ............ H01L 21/4857 |
|---|---|---|---|---|
| | | | | 257/203 |
| 8,174,109 | B2 * | 5/2012 | Uchiyama | ............ H01L 21/486 |
| | | | | 257/686 |
| 8,188,375 | B2 * | 5/2012 | Kawabata | ......... H01L 23/49822 |
| | | | | 174/260 |
| 8,338,934 | B2 * | 12/2012 | Wu | ..................... H01L 23/5389 |
| | | | | 257/687 |
| 9,142,524 | B2 * | 9/2015 | Kyozuka | ................ H01L 24/19 |

FOREIGN PATENT DOCUMENTS

JP          4835124 B     10/2011

* cited by examiner

*Primary Examiner* — Luan C Thai
(74) *Attorney, Agent, or Firm* — Oblon, McClelland, Maier & Neustadt, L.L.P.

(57) ABSTRACT

A wiring board includes conductor layers, core layers including a first core layer and a second core layer formed such that each of the first and second core layers includes a core material, an intermediate insulating layer formed between the first core layer and second core layer such that the intermediate insulating layer does not contain a core material, and an electronic component positioned between the first core layer and second core layer such that the electronic component is embedded in the intermediate insulating layer. At least one of the first and second core layers has a multilayer structure including a resin layer and an adhesive layer laminated on the resin layer such that the resin layer includes the core material and that the adhesive layer does not contain a core material, and the conductor layers include a conductor layer laminated on the adhesive layer of the multilayer structure.

20 Claims, 12 Drawing Sheets

WIRING BOARD

CROSS-REFERENCE TO RELATED APPLICATIONS

The present application is based upon and claims the benefit of priority to Japanese Patent Application No. 2016-147556, filed Jul. 27, 2016, the entire contents of which are incorporated herein by reference.

BACKGROUND OF THE INVENTION

Field of the Invention

The present invention relates to a wiring board obtained by laminating multiple conductor layers and multiple insulating layers.

Description of Background Art

For example, Japanese Patent No. 4835124 describes a wiring board with a built-in electronic component. The entire contents of this publication are incorporated herein by reference.

SUMMARY OF THE INVENTION

According to one aspect of the present invention, a wiring board includes conductor layers, core layers including a first core layer and a second core layer formed such that each of the first and second core layers includes a core material, an intermediate insulating layer formed between the first core layer and the second core layer such that the intermediate insulating layer does not contain a core material, and an electronic component positioned between the first core layer and the second core layer such that the electronic component is embedded in the intermediate insulating layer. At least one of the first and second core layers has a multilayer structure including a resin layer and an adhesive layer laminated on the resin layer such that the resin layer includes the core material and that the adhesive layer does not contain a core material, and the conductor layers include a conductor layer laminated on the adhesive layer of the multilayer structure.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENTS

Embodiments will now be described with reference to the accompanying drawings, wherein like reference numerals designate corresponding or identical elements throughout the various drawings.

First Embodiment

Figure 1:
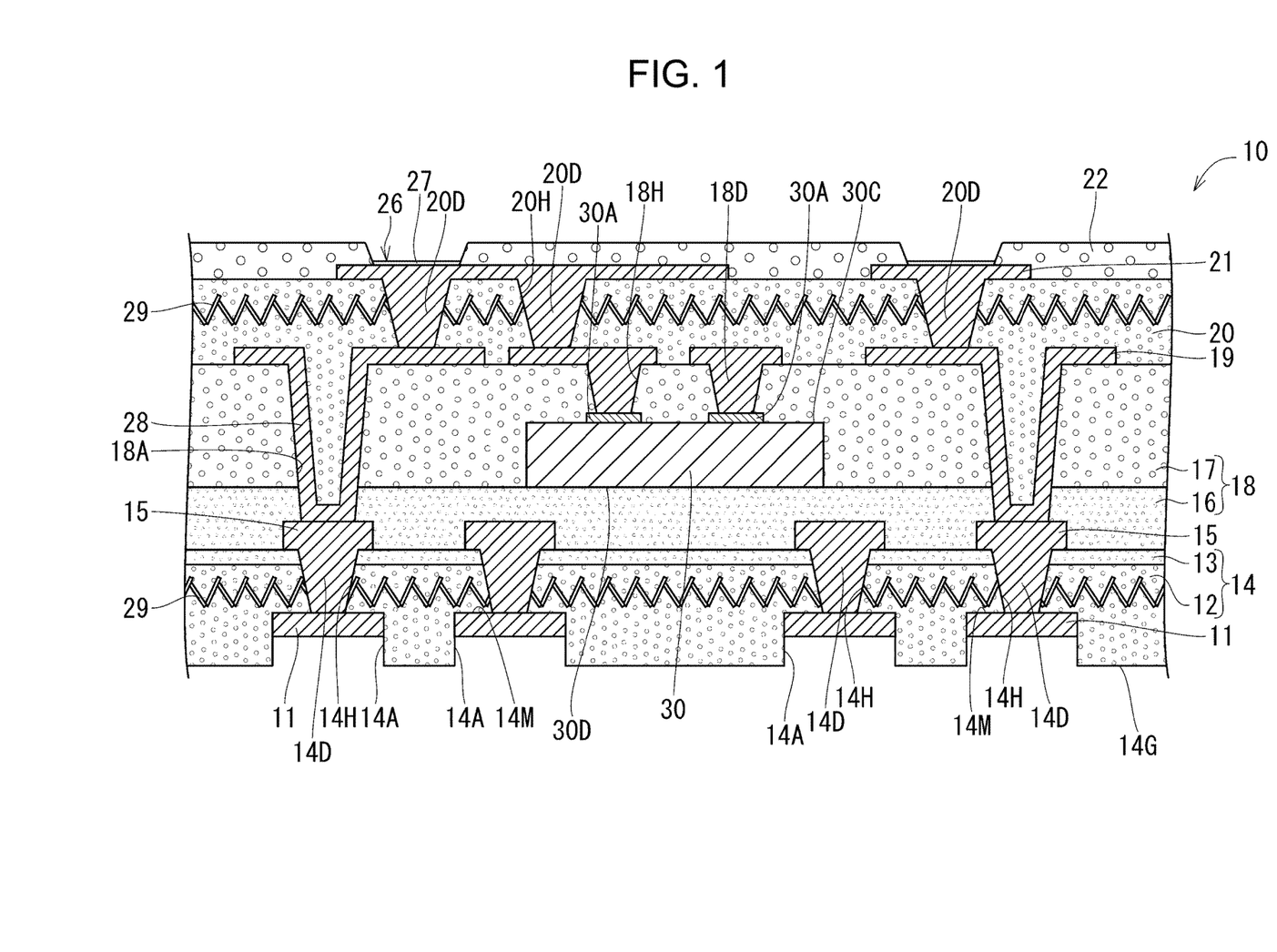
FIG. 1 is a cross-sectional side view of a wiring board according to a first embodiment of the present invention.

In the following, a first embodiment of the present invention is described with reference to FIG. 1-12. As illustrated in FIG. 1, a wiring board 10 of the present embodiment has a first core layer 14 and a second core layer 20 that each contains a core material 29, and an intermediate insulating layer 18 that is arranged between the first core layer 14 and the second core layer 20. A first conductor layer 11 is formed on a surface of the first core layer 14 on a far side from the intermediate insulating layer 18, and a second conductor layer 21 is formed on a surface of the second core layer 20 on a far side from the intermediate insulating layer 18. A third conductor layer 15 is formed on a surface of the first core layer 14 on a near side from the intermediate insulating layer 18, and a fourth conductor layer 19 is formed on a surface of the second core layer 20 on a near side from the intermediate insulating layer 18. The intermediate insulating layer 18 is laminated on the third conductor layer 15, and the fourth conductor layer 19 is laminated on the intermediate insulating layer 18. A solder resist layer 22 is laminated on the second conductor layer 21.

As described above, in the wiring board 10, in an order from one end in a lamination direction, the first conductor layer 11, the first core layer 14, the third conductor layer 15, the intermediate insulating layer 18, the fourth conductor layer 19, the second core layer 20, the second conductor layer 21, and the solder resist layer 22 are laminated. In other words, in the wiring board 10 of the present embodiment, the first core layer 14, the intermediate insulating layer 18, the second core layer 20, and the solder resist layer 22 corresponding to "multiple insulating layers" according to an embodiment of the present invention, and the first conductor layer 11, the second conductor layer 21, the third conductor layer 15, and the fourth conductor layer 19 corresponding to "multiple conductor layers" according to an embodiment of the present invention are alternately laminated.

Recesses (14A) that each open toward an outer side in a thickness direction of the wiring board 10 are provided in the first core layer 14. The first conductor layer 11 is formed on bottom surfaces (14M) of the recesses (14A). Multiple tapered via holes (14H) that are each gradually reduced in diameter from the third conductor layer 15 side toward the first conductor layer 11 side are formed in the first core layer 14. Then, the first conductor layer 11 and the third conductor layer 15 are connected by via conductors (14D) formed by filling the via holes (14H) with plating. A thickness of the first conductor layer 11 is smaller than a depth of each of the recesses (14A). That is, in the wiring board 10, an exposed surface of the first conductor layer 11 is arranged on an inner side (the third conductor layer 15 side) of an outer surface (14G) of the first core layer 14.

An electronic component 30 is embedded in the intermediate insulating layer 18. Of the electronic component 30, an active surface (30C) on which terminals (30A, 30A) are provided is arranged facing the fourth conductor layer 19 side, and a non-active surface (30D) on which terminals (30A, 30A) are not provided is arranged facing the third conductor layer 15 side. Multiple via holes (18H) and via conductors (18D) obtained by filling the via holes (18H) with plating are formed in the intermediate insulating layer 18. Then, the terminals (30A) of the electronic component and the fourth conductor layer 19 are connected by the via conductors (18D).

Further, through holes (18A), each penetrating the intermediate insulating layer 18, are formed in the intermediate insulating layer 18. The through holes (18A) each have a tapered shape that is gradually reduced in diameter from the fourth conductor layer 19 side toward the third conductor layer 15 side. Further, one end of each of the through holes (18A) is closed by the third conductor layer 15.

Connection conductors 28 that connect the third conductor layer 15 and the fourth conductor layer 19 are respectively formed on inner sides of the through holes (18A). The connection conductors 28 are formed of plating covering side walls of the through holes (18A) and the third conductor layer 15 and each have a tubular shape that is closed at one end on the third conductor layer 15 side. A portion of a resin of the second core layer 20 laminated on the fourth conductor layer 19 enters inner sides of the connection conductors 28.

Multiple tapered via holes (20H) that are each gradually reduced in diameter from the second conductor layer 21 side toward the fourth conductor layer 19 side are formed in the second core layer 20. Then, the fourth conductor layer 19 and the second conductor layer 21 are connected by via conductors (20D) formed by filling the via holes (20H) with plating. When viewed from the thickness direction of the wiring board 10, the via holes (20H) and the connection conductors 28 are respectively arranged at positions that do not overlap each other.

Multiple pad holes are formed in the solder resist layer 22. Portions of the second conductive layer 21 that are respectively exposed from the pad holes become pads 26. A metal film 27 including a nickel layer, a palladium layer and a gold layer is formed on each of the pads 26.

The first core layer 14, the intermediate insulating layer 18, and the second core layer 20 are all each formed from a resin sheet (for example, a prepreg, an insulating film for a build-up substrate, and the like). Here, in the wiring board 10 of the present embodiment, the first core layer 14 and the second core layer 20 each contain a fibrous or cloth-like core material 29 formed of, for example, a glass cloth or the like. The first core layer 14 and the second core layer 20 each have a thicknesses of 100 μm or less. The intermediate insulating layer 18 does not contain a fibrous or cloth-like core material 29.

Here, as illustrated in FIG. 1, the first core layer 14 has a two-layer structure in which an adhesive layer 13 is laminated on a resin layer 12. The third conductor layer 15 is laminated on the adhesive layer 13 of the first core layer 14. The resin layer 12 is formed by containing the core material 29 in an insulating resin. On the other hand, the adhesive layer 13 is a resin layer that does not contain a core material 29. The adhesive layer 13 may contain inorganic filler or the like.

Further, the intermediate insulating layer 18 has a two-layer structure in which a second insulating layer 17 is laminated on a first insulating layer 16. The first insulating layer 16 is arranged on the first core layer 14 side and is formed of the same material as the adhesive layer 13. That is, the third conductor layer 15 connected to the connection conductors 28 is covered by the first insulating layer 16 that is formed on the adhesive layer 13 and is formed of the same material as the adhesive layer 13. Further, the electronic component 30 is placed on the first insulating layer 16 and a side surface and an upper surface of the electronic component 30 are covered by the second insulating layer 17.

Next, a method for manufacturing the wiring board 10 of the present embodiment is described.

Figures 2A, 2B:
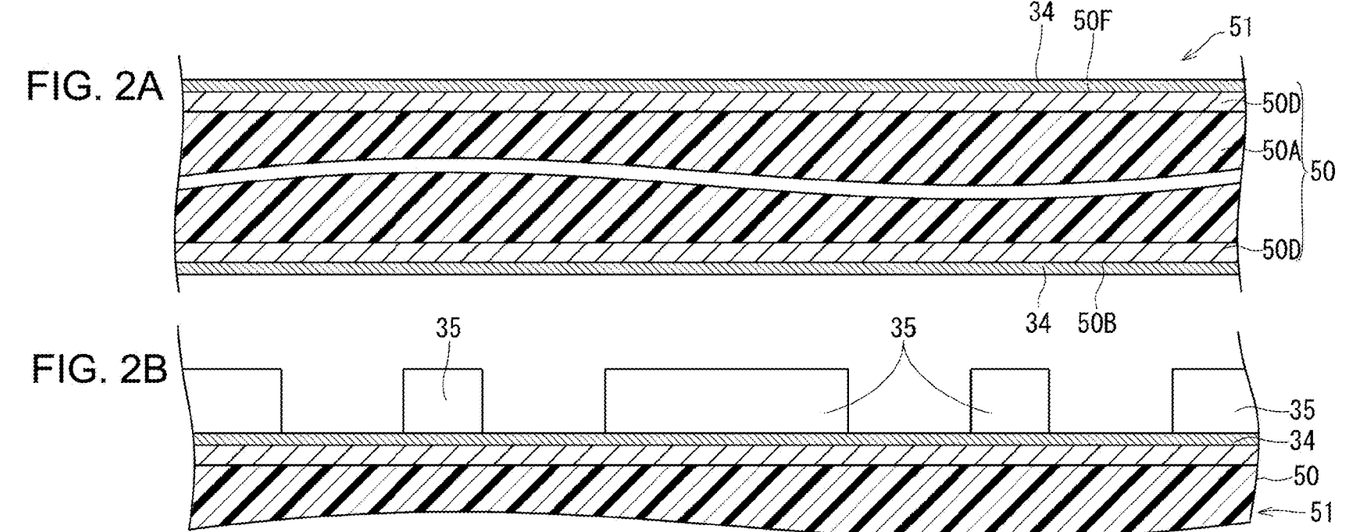
FIG. 2A-2C are cross-sectional side views illustrating manufacturing processes of the wiring board.

(1) As illustrated in FIG. 2A, a support member 51 is prepared in which copper carriers (34, 34) are respectively laminated on an F surface (50F), which is a front side surface of a support substrate 50, and a B surface (50B), which is a back side surface of the support substrate 50. The support substrate 50 is formed by laminating a copper foil (50D) on both front side and back side surfaces of a resin layer (50A). Peripheral portions of the copper foil (50D) and the carrier 34 of the support substrate 50 are bonded to each other.

Since the same processing is performed on the carrier 34 on the F surface (50F) side of the support substrate 50 and on the carrier 34 on the B surface (50B) side of the support substrate 50, hereinafter, processing performed on the carrier 34 on the F surface (50F) side is described as an example.

(2) As illustrated in FIG. 2B, a plating resist 35 of a predetermined pattern is formed on the carrier 34 of the support member 51.

Figure 2C:
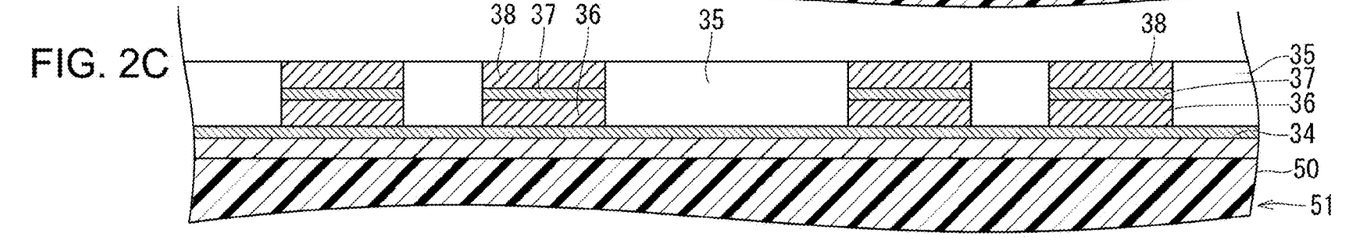

(3) As illustrated in FIG. 2C, a copper electrolytic plating treatment is performed, and a copper plating layer 36 is formed on portions of the carrier 34 that are exposed from the plating resist 35. Next, a nickel electrolytic plating treatment is performed, and a nickel plating layer 37 is formed on the copper plating layer 36. Next, a copper electrolytic plating treatment is performed, and a copper plating layer 38 is formed on the nickel plating layer 37.

Figure 3A:
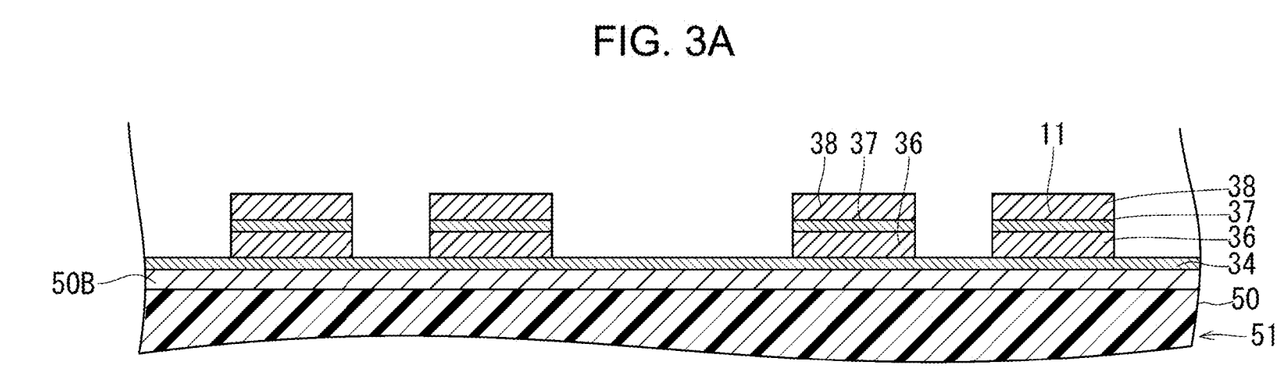
FIGS. 3A and 3B are cross-sectional side views illustrating manufacturing processes of the wiring board.

(4) The plating resist 35 is peeled off. As illustrated in FIG. 3A, the first conductor layer 11 is formed by the remaining copper plating layer 38.

Figure 3B:
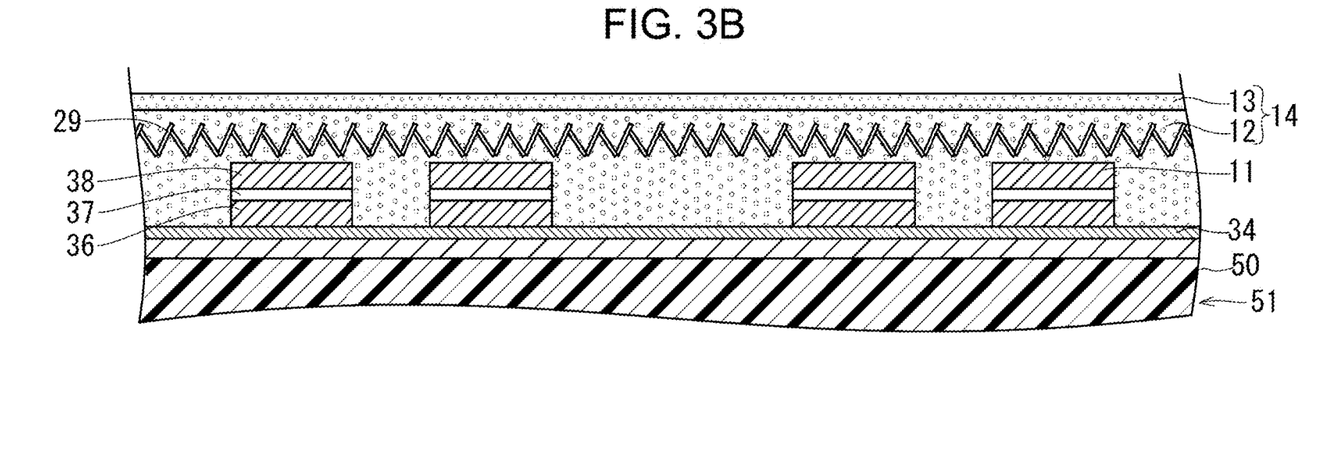

(5) As illustrated in FIG. 3B, as the first core layer 14, the resin layer 12 containing the core material 29 and the adhesive layer 13 superimposed on the resin layer 12 are laminated on the first conductor layer 11, and are hot-pressed.

Figure 4A:
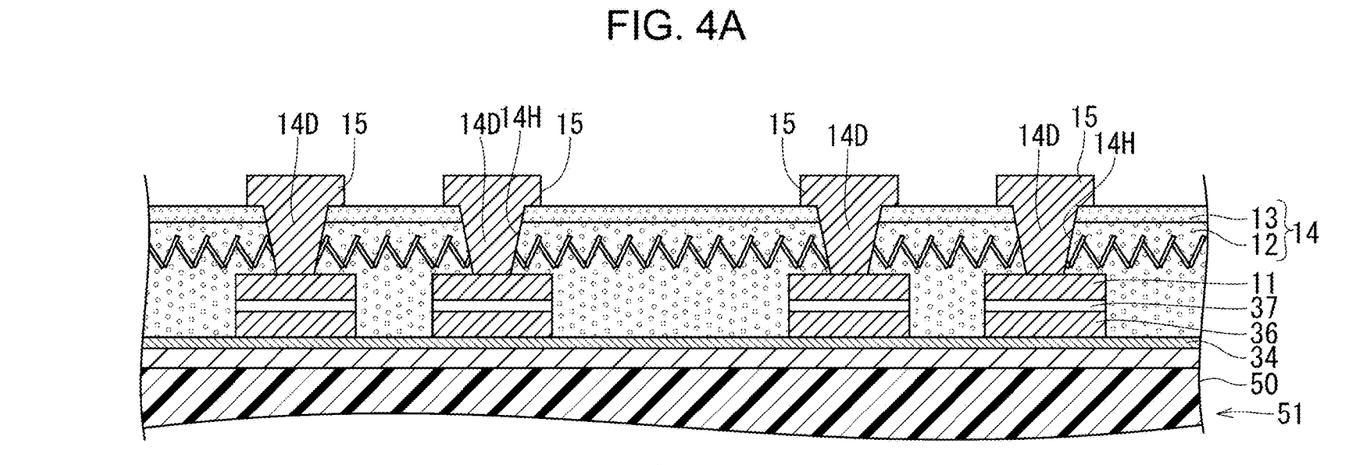
FIGS. 4A and 4B are cross-sectional side views illustrating manufacturing processes of the wiring board.

(6) As illustrated in FIG. 4A, the via holes (14H) are formed by irradiating $CO_2$ laser to the first core layer 14. The via holes (14H) are arranged on the first conductor layer 11.

(7) Next, an electroless plating treatment is performed. An electroless plating film (not illustrated in the drawings) is formed on the first core layer 14 and in the via holes (14H). Next, a plating resist (not illustrated in the drawings) of a predetermined pattern is formed on the electroless plating film. Next, an electrolytic plating treatment is performed. The via conductors (14D) are formed by filling the via holes (14H) with plating. Further, an electrolytic plating film is formed on portions of the electroless plating film (not illustrated in the drawings) on the first core layer 14, the portions being exposed from the plating resist (not illustrated in the drawings).

(8) The plating resist is peeled off, and the electroless plating film (not illustrated in the drawings) under the plating resist is removed. As illustrated in FIG. 4A, the third conductor layer 15 is formed on the first core layer 14 by the remaining electrolytic plating film and electroless plating film. Then, the first conductor layer 11 and the third conductor layer 15 are connected by the via conductors (14D).

Figure 4B:
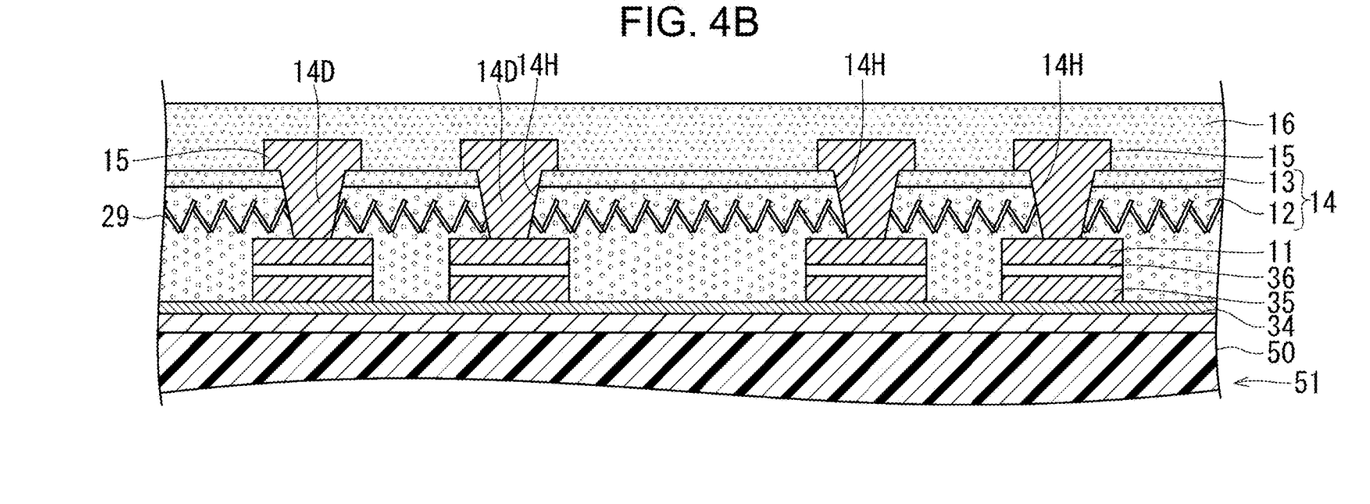

(9) As illustrated in FIG. 4B, the first insulating layer 16 limed of the same material as the adhesive layer 13 is laminated on the third conductor layer 15. Then, the resin of the first insulating layer 16 enters gaps between adjacent portions of the third conductor layer 15.

Figure 5A:
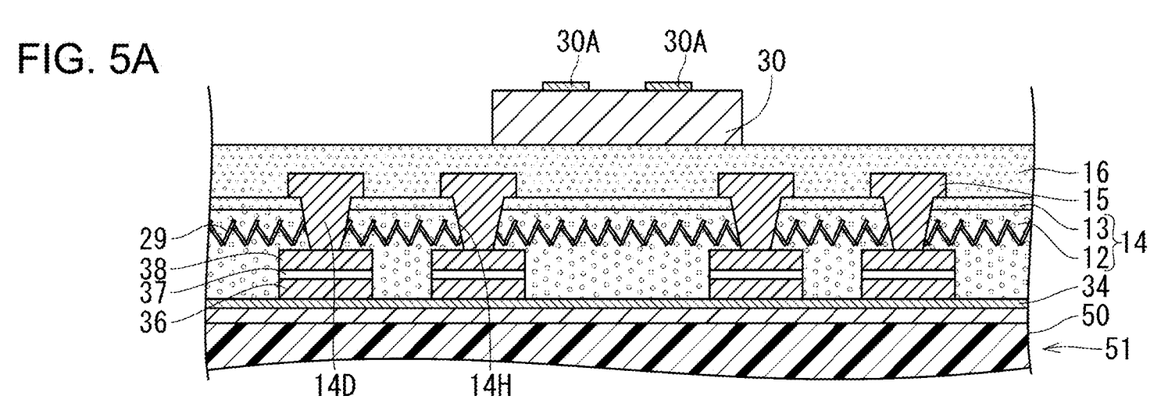
FIGS. 5A and 5B are cross-sectional side views illustrating manufacturing processes of the wiring board.

(10) As illustrated in FIG. 5A, the electronic component 30 is placed on the first insulating layer 16. In this case, the electronic component 30 is arranged such that the terminals (30A, 30A) face upward.

Figure 5B:
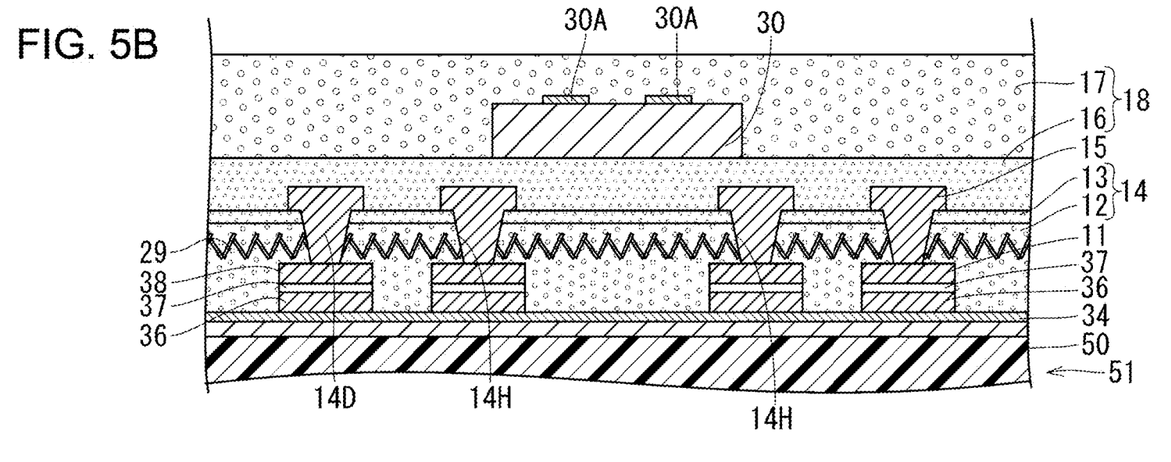

(11) As illustrated in FIG. 5B, the second insulating layer 17 is laminated on the first insulating layer 16. Next, a thermal curing process is performed, and the intermediate insulating layer 18 is formed that includes the first insulating layer 16 and the second insulating layer 17 and in which the electronic component 30 is embedded.

In the processes (10) and (11), the processing from the placement of the electronic component 30 to the lamination of the second insulating layer 17 includes a portion for arranging an electronic component on the F surface (50F) side of the support substrate 50 and a portion for arranging an electronic component on the B surface (50B) side of the support substrate 50, which are separately performed. Specifically, first, the processing is performed on the F surface (50F) side of the support substrate 50 with the F surface (50F) facing upward. Thereafter, the support substrate 50 is flipped over. Then, the same processing is performed on the B surface (50B) side of the support substrate 50 (see FIG. 2A).

Figure 6:
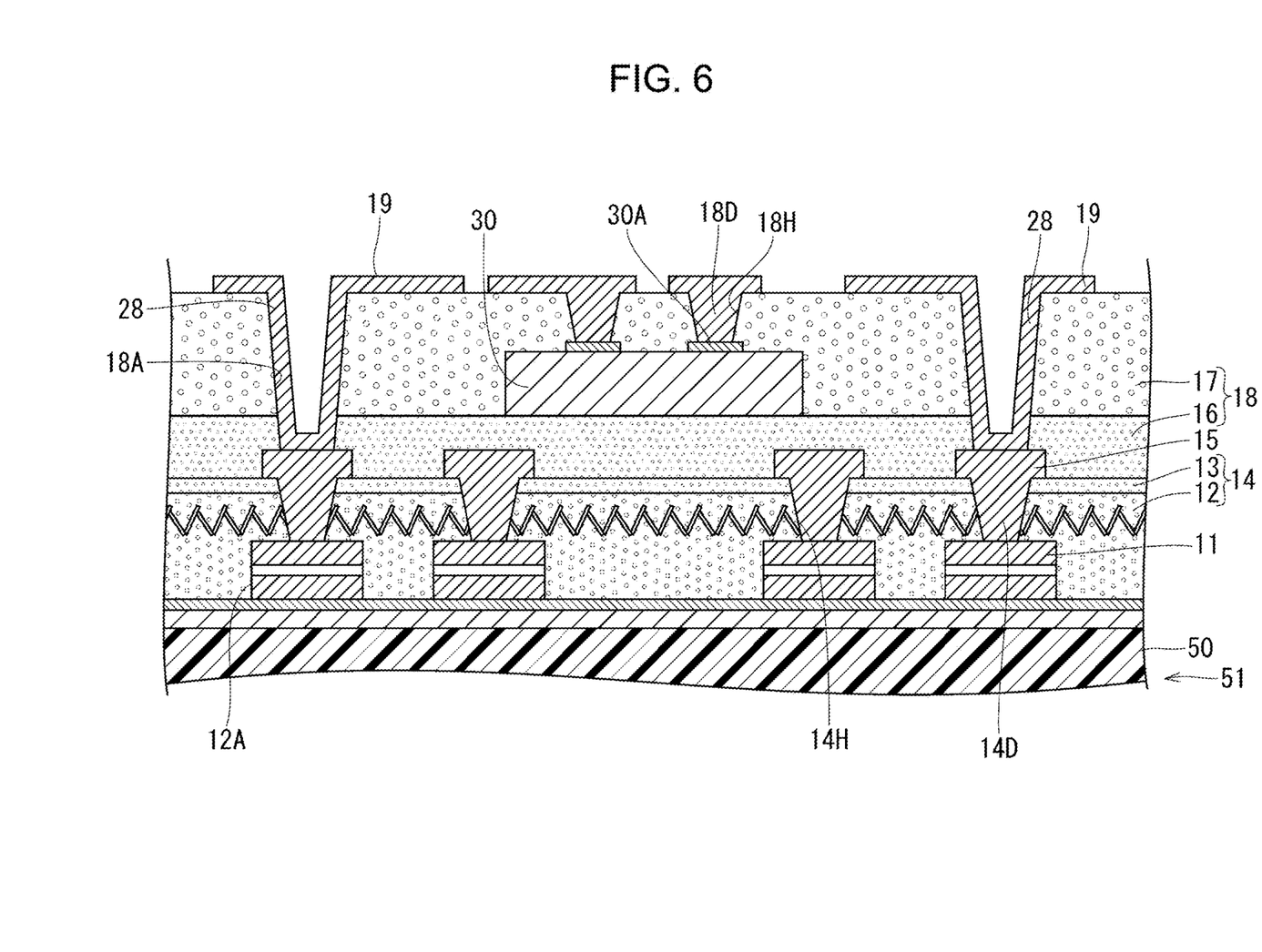
FIG. 6 is a cross-sectional side view illustrating a manufacturing process of the wiring board.

(12) As illustrated in FIG. 6, the via holes (18H) and the through holes (18A) are formed by irradiating CO2 laser to the intermediate insulating layer 18. The through holes (18A) are formed on the third conductor layer 15. The via holes (18H) are forested on the terminals (30A, 30A) of the electronic component 30. The through holes (18A) are formed penetrating two layers including the first insulating layer 16 and the second insulating layer 17 that form the intermediate insulating layer 18. The via holes (18H) are formed only in the second insulating layer 17 of the intermediate insulating layer 18.

(13) Next, an electroless plating treatment is performed. An electroless plating film (not illustrated in the drawings) is formed on the intermediate insulating layer 18 and in the via holes (18H) and in the through holes (18A). Next, a plating resist (not illustrated in the drawings) of a predetermined pattern is formed on the electroless plating film. Next, an electrolytic plating treatment is performed. The via conductors (18D) are formed by filling the via holes (18H) with plating. Further, the connection conductors 28 are formed by covering the side walls of the through holes (18A) and the third conductor layer 15 with plating. Further, an electrolytic plating film is formed on portions of the electroless plating film (not illustrated in the drawings) on the intermediate insulating layer 18, the portions being exposed from the plating resist (not illustrated in the drawings).

(14) Next, the plating resist is peeled off, and the electroless plating film (not illustrated in the drawings) under the plating resist is removed. As illustrated in FIG. 6, the fourth conductor layer 19 is formed on the intermediate insulating layer 18 by the remaining electrolytic plating film and electroless plating film. Then, the third conductor layer 15 and the fourth conductor layer 19 are connected by the connection conductors 28, and the third conductor layer 15 and the terminals (30A) of the electronic component 30 are connected by the via conductors (18D).

Figure 7:
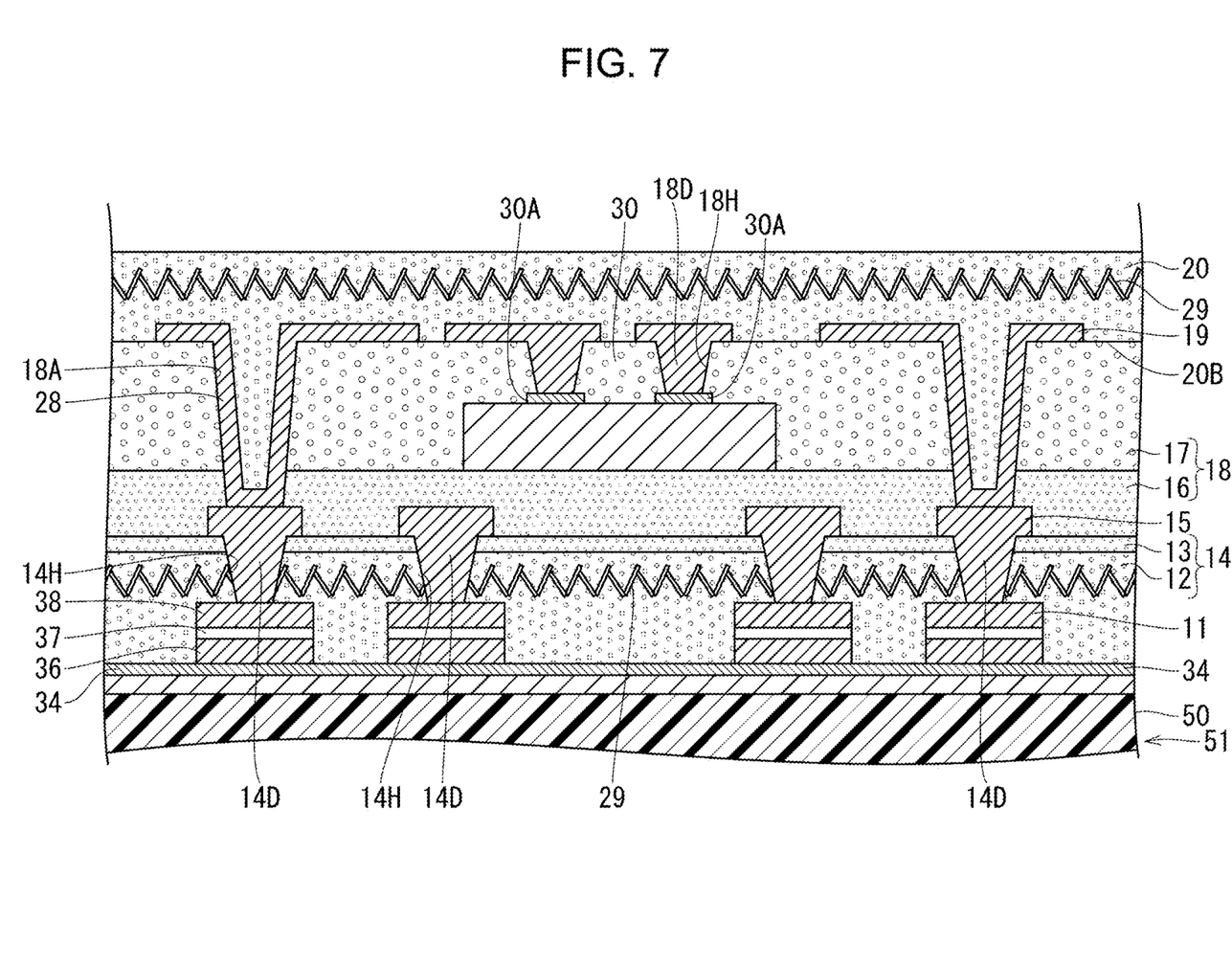
FIG. 7 is a cross-sectional side view illustrating a manufacturing process of the wiring board.

(15) Next, as illustrated in FIG. 7, the second core layer 20 is laminated on the fourth conductor layer 19 and is hot-pressed. In this case, the inner sides of the connection conductors 28 that each have bottomed tubular shape are filled with a thermosetting resin exuded from the second core layer 20.

Figure 8:
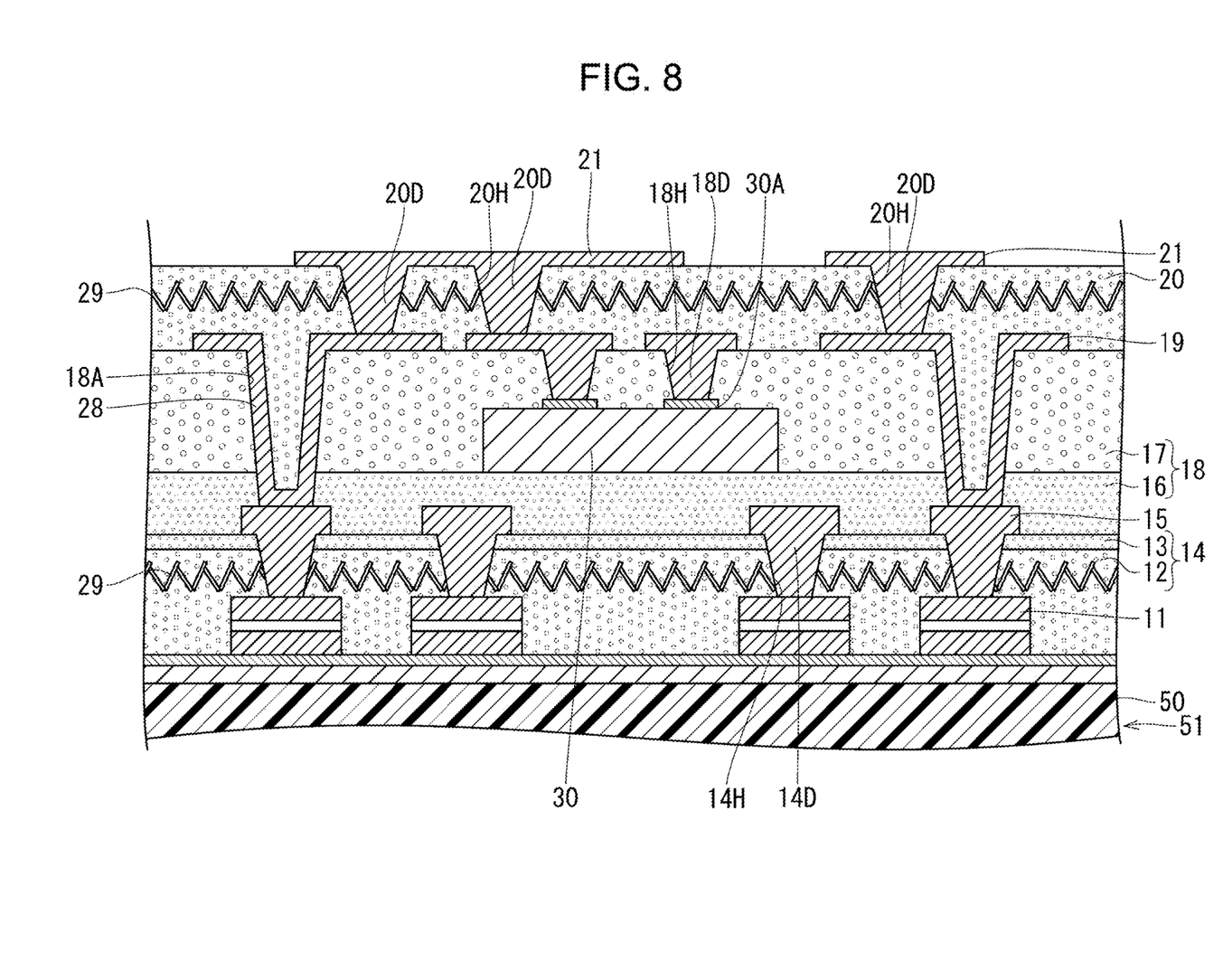
FIG. 8 is a cross-sectional side view illustrating a manufacturing process of the wiring board.

(16) Next, as illustrated in FIG. 8, the via holes (20H) are formed by irradiating CO2 laser to the second core layer 20. The via holes (20H) are arranged on the fourth conductor layer 19.

(17) Next, an electroless plating treatment is performed. An electroless plating film (not illustrated in the drawings) is formed on the second core layer 20 and in the via holes (20H). Next, a plating resist (not illustrated in the drawings) of a predetermined pattern is formed on the electroless plating film Next, an electrolytic plating treatment is performed. The via conductors (20D) are formed by filling the via holes (20H) with plating. Further, an electrolytic plating film is formed on portions of the electroless plating film (not illustrated in the drawings) on the second core layer 20, the portions being exposed from the plating resist (not illustrated in the drawings).

(18) The plating resist is peeled off, and the electroless plating film (not illustrated in the drawings) under the plating resist is removed. As illustrated in FIG. 8, the second conductor layer 21 is formed on the second core layer 20 by the remaining electrolytic plating film and electroless plating film. Then, the fourth conductor layer 19 and the second conductor layer 21 are connected by the via conductors (20D).

Figure 9:
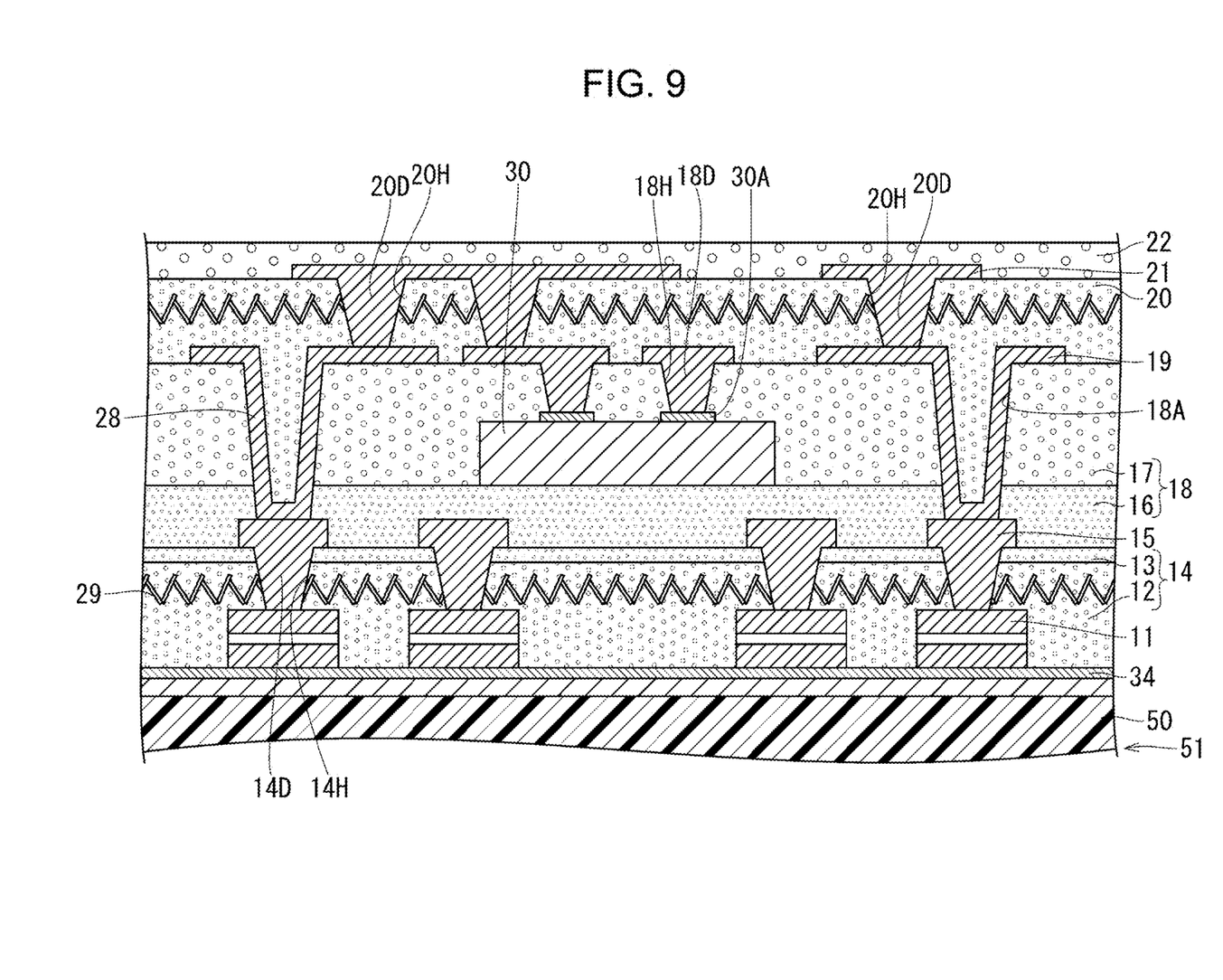
FIG. 9 is a cross-sectional side view illustrating a manufacturing process of the wiring board.

(19) As illustrated in FIG. 9, the solder resist layer 22 is laminated on the second conductor layer 21.

Figure 10:
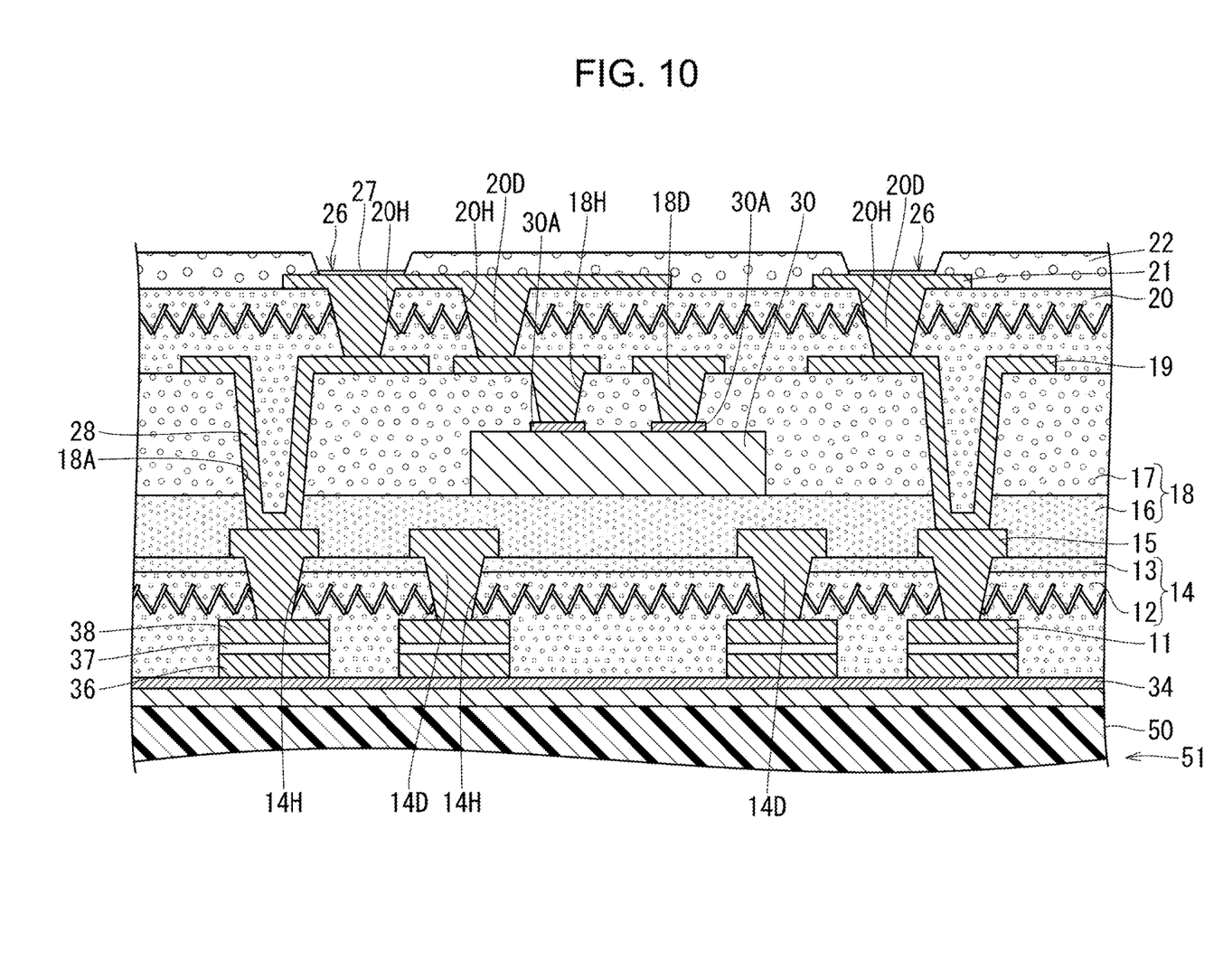
FIG. 10 is a cross-sectional side view illustrating a manufacturing process of the wiring board.

(22) As illustrated in FIG. 10, tapered pad holes are formed at predetermined places in the solder resist layer 22, and portions of the second conductor layer 21 exposed from the pad holes become the pads 26.

(23) On each of the pads 26, a nickel layer, a palladium layer and a gold layer are laminated in this order and a metal film 27 illustrated in FIG. 10 is formed. Instead of the metal film 27, it is also possible to perform a surface treatment using OSP (preflux).

Figure 11:
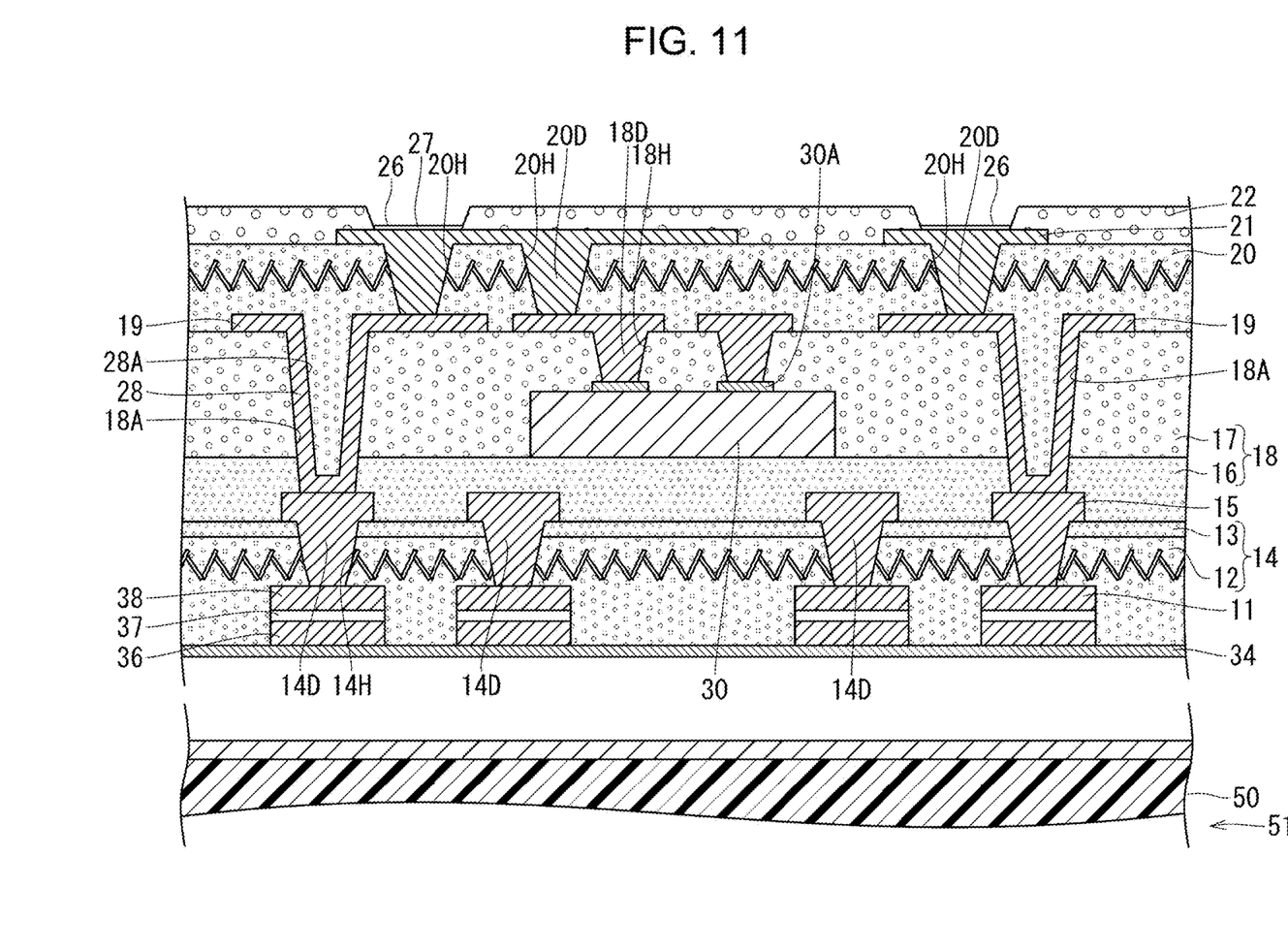
FIG. 11 is a cross-sectional side view illustrating a manufacturing process of the wiring board.

(24) As illustrated in FIG. 11, the resulting substrate is peeled off from the support substrate 50.

(25) The carrier 34, the copper plating layer 36, and the nickel plating layer 37 are each removed by etching. As a result, the wiring board 10 illustrated in FIG. 1 is completed.

Figure 12:
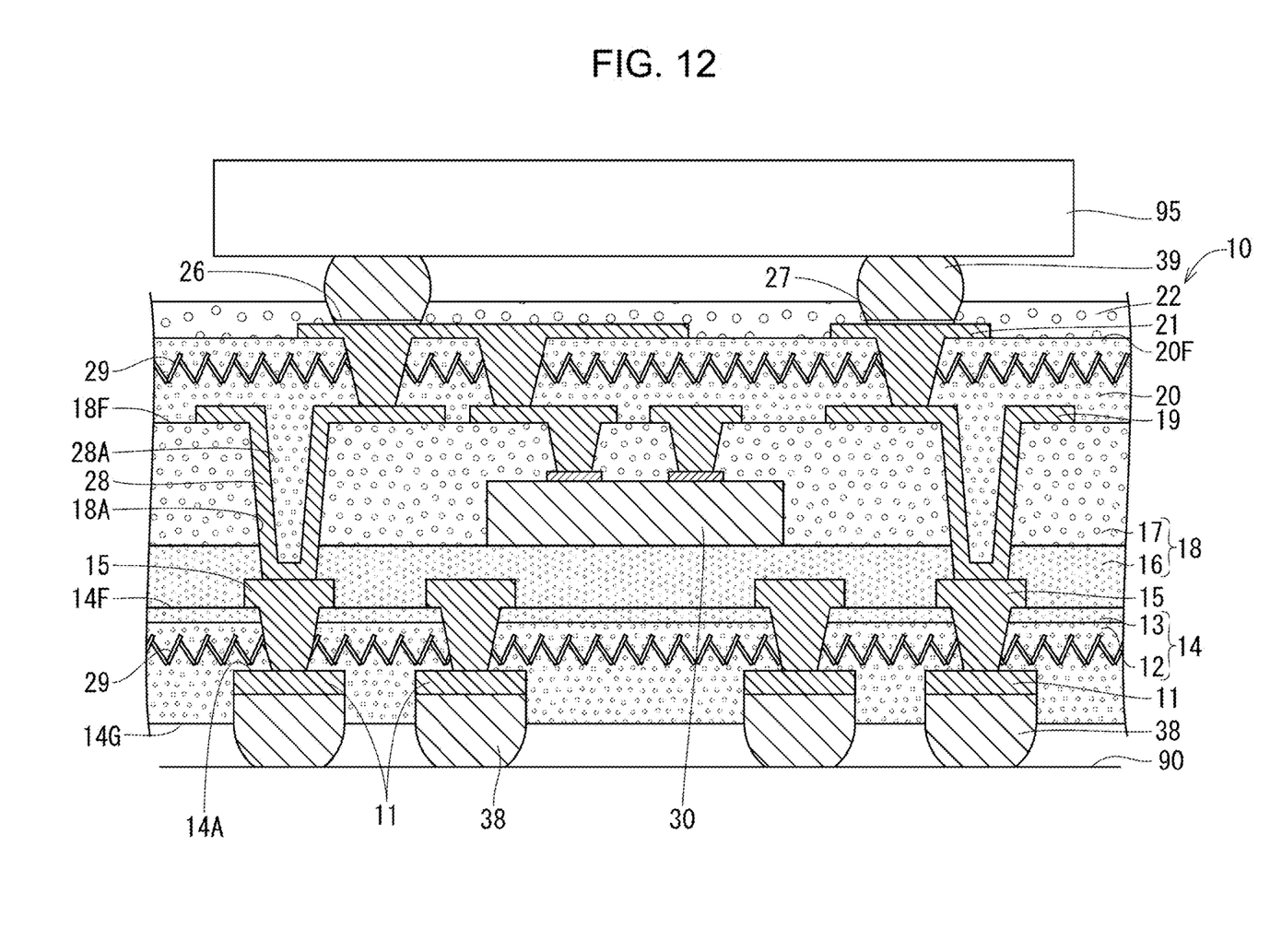
FIG. 12 is a cross-sectional side view illustrating a state in which the wiring board is applied.

The description about the structure and the manufacturing method of the wiring board 10 of the present embodiment is as given above. Next, an example of use and an operation effect of the wiring board 10 are described. For example, as illustrated in FIG. 12, of the wiring board 10 of the present embodiment, the first conductor layer 11 is connected to a motherboard 90 and the second conductor layer 21 is connected to an electronic component 95 such as a CPU. Specifically, solder bumps 39 are respectively formed on the pads 26, and the second conductor layer 21 and the electronic component 95 are connected to each other via the solder bumps 39. Further, solder bumps 38 are formed on the first conductor layer 11, and the first conductor layer 11 and the motherboard 90 are connected to each other via the solder bumps 38.

In the wiring board 10 of the present embodiment, the first core layer 14 and the second core layer 20 are each formed from a resin sheet containing a core material 29. Therefore, as compared to a wiring board in which all insulating resin layers are each formed from a resin sheet that does not contain a core material 29, strength of the wiring board 10 of the present embodiment can be improved.

Further, the electronic component 30 embedded in the wiring board 10 is likely to generate heat. Therefore, there is a high risk that the conductor layer 15 near of the electronic component 30 may peel off from the first core layer 14. Here, in the wiring board 10 of the present embodiment, the first core layer 14 is formed to include the resin layer 12 containing the core material 29 and the adhesive layer 13 laminated on the resin layer 12. The conductive layer 15 is formed on the adhesive layer 13 of the first core layer 14. As a result, as compared to a case where the conductor layer 15 is directly laminated on the resin layer 12 containing the core material 29, in the case of the wiring board 10 of the present embodiment, the risk that the conductive layer 15 may peel off from the first core layer 14 can be suppressed.

Further, in the wiring board 10 of the present embodiment, the intermediate insulating layer 18 also has a two-layer structure. The first insulating layer 16 arranged on the first core layer 14 side is formed of the same material as the adhesive layer 13 of the first core layer 14 arranged on the intermediate insulating layer side. That is, the adhesive layer 13 and the first insulating layer 16 have the same thermal expansion coefficient. As a result, peeling between the adhesive layer 13 of the first core layer 14 and the first insulating layer 16 of the intermediate insulating layer 18 is suppressed and thus cracking is unlikely to occur. Therefore, connectivity can be improved.

Further, the connection conductors 28 connecting the third conductor layer 15 and the fourth conductor layer 19 are formed of plating covering the through holes (18A) formed in the intermediate insulating layer 18, and the resin of the second core layer 20 enters the inner sides of the connection conductors 28. As a result, a load applied to the third conductor layer 15 can be reduced as compared to filled vias formed by filling the through holes (18A) with plating.

Further, in the wiring board 10 of the present embodiment, the first conductor layer 11 is thinned on the bottom surfaces (14M) of the recesses (14A) of the first core layer 14. Therefore, a total thickness of the wiring board 10 can be reduced as compared to a case where the first conductor layer 11 is formed on the first core layer 14. Further, the exposed surface of the first conductor layer 11 is positioned on an inner side (the third conductor layer 15 side) of the outer surface of the first core layer 14. Therefore, unnecessary contact between the first conductor layer 11 and the electronic component 95 can be suppressed.

Other Embodiments

The present invention is not limited to the above-described embodiment. For example, embodiments described below are also included in the technical scope of the present invention. Further, in addition to the embodiments described below, the present invention can also be embodied in various modified forms within the scope without departing from the spirit of the present invention.

(1) In the above embodiment, only the first core layer 14 has a two-layer structure that includes the resin layer 12 and the adhesive layer 13. However, it is also possible that only the second core layer 20 has a two-layer structure that includes a resin layer 12 and an adhesive layer 13, or both the first core layer 14 and the second core layer 20 have a two-layer structure that includes a resin layer 12 and an adhesive layer 13.

(2) It is also possible that the intermediate insulating layer 18 has a cavity that accommodates the electronic component 30. For example, an intermediate insulating layer has a two-layer structure that includes two resin layers. One resin layer is provided with a cavity that accommodates the electronic component 30. A gap between the electronic component 30 accommodated in the cavity and an inner wall of the cavity is filled in resin of the other resin layer.

(3) In the above embodiment, it is also possible that the electronic component 95 such as a CPU is connected to the first conductor layer 11, and the motherboard 90 is connected to the second conductor layer 21 side.

(4) In the above embodiment, the copper plating layer 38 that becomes the first conductor layer 11 is formed after the copper plating layer 36 and the nickel plating layer 37 are formed on the carrier 34. However, it is also possible that the copper plating layer 38 that becomes the first conductor layer 11 is directly formed on the carrier 34.

(5) In the above embodiment, the first conductor layer 11 is embedded in the first core layer 14. However, it is also possible that the first conductor layer 11 is laminated on the first core layer 14.

(6) In the above embodiment, a glass cloth is used as an example of the core material. However, without being limited to this, it is also possible that the core material is carbon fiber, a glass nonwoven fabric, an aramid cloth or an aramid nonwoven fabric, or a combination thereof.

(7) It is also possible that the connection conductors 28 are via conductors formed by filling the through holes (18A) with plating.

In a wiring board in which an intermediate insulating layer with a built-in electronic component is arranged between a first core layer and a second core layer that each contains a core material, improvement in connectivity is desired.

A wiring board according to an embodiment of the present invention is obtained by laminating multiple insulating layers and multiple conductor layers. The multiple insulating layers include first and second core layers that each contain a core material, and an intermediate insulating layer that does not contain a core material and is provided between the first core layer and the second core layer. The wiring board includes an electronic component embedded in the intermediate insulating layer. At least one of the first and second core layers has a multilayer structure that includes a resin layer that contains a core material and an adhesive layer that does not contain a core material and is laminated on the resin layer. One of the conductor layers is laminated on the adhesive layer.

Obviously, numerous modifications and variations of the present invention are possible in light of the above teachings. It is therefore to be understood that within the scope of the appended claims, the invention may be practiced otherwise than as specifically described herein.

The invention claimed is:
1. A wiring board, comprising:
a plurality of conductor layers including a first conductor layer, a second conductor layer, a third conductor layer and a fourth conductor layer;
a plurality of core layers comprising a first core layer and a second core layer formed such that each of the first and second core layers includes a core material and that the first core layer is interposed between the first conductor layer and the third conductor layer and the second core layer is interposed between the fourth conductor layer and the second conductor layer;

an intermediate insulating layer formed between the first core layer and the second core layer such that the intermediate insulating layer does not contain a core material;

a via conductor structure formed in the first core layer such that the via conductor structure connects the first conductor layer and the third conductor layer; and an electronic component positioned between the first core layer and the second core layer such that the electronic component is embedded in the intermediate insulating layer, wherein the first core layer has a multilayer structure comprising a resin layer and an adhesive layer laminated on the resin layer such that the resin layer includes the core material and that the adhesive layer does not contain a core material, the adhesive layer of the multilayer structure is formed adjacent to the intermediate insulating layer such that the third conductor layer is laminated on the adhesive layer and is interposed between the adhesive layer and intermediate insulating layer, the intermediate insulating layer has a multilayer structure comprising a first insulating layer and a second insulating layer laminated on the first insulating layer, the electronic component is mounted on the first insulating layer of the intermediate insulating layer, the first insulating layer of the intermediate insulating layer is laminated on the adhesive layer of the multilayer structure, and the first insulating layer and the adhesive layer are made of a same material.

2. A wiring board according to claim 1, further comprising:

a plurality of tapered via conductors formed in the second core layer such that the plurality of tapered via conductors is reducing in diameter in a same direction, wherein the via conductor structure formed in the first core layer comprises a plurality of tapered via conductors formed in the first core layer such that the plurality of tapered via conductors is reducing in diameter in a same direction.

3. A wiring board according to claim 1, wherein the first conductor layer is formed on an outer surface of the first core layer and the second conductor layer is formed on an outer surface of the second core layer such that the first and second conductor layers form outermost conductor layers in the plurality of conductor layers.

4. A wiring board according to claim 3, wherein the first core layer has a plurality of recess portions each opening outward such that the first conductive layer is formed at a bottom of each of the recess portions and has a thickness smaller than a depth of each of the recess portions.

5. A wiring board according to claim 1, wherein the electronic component comprises an IC chip.

6. A wiring board according to claim 3, further comprising:

a plurality of connection conductors formed in a plurality of through holes penetrating through the intermediate insulating layer such that each of the connection conductors has a tubular shape closed at one end and filled with resin derived from one of the first and second core layers, wherein the third conductor layer is formed between the first core layer and the intermediate insulating layer and the fourth conductor layer is formed between the second core layer and the intermediate insulating layer such that the plurality of connection conductors is connecting the third and fourth conductor layers.

7. A wiring board according to claim 6, wherein the each of the connection conductors has the tubular shape closed at one end on the third conductor layer and filled with resin derived from the second core layer, the first core layer comprises the multilayer structure comprising the resin layer and the adhesive layer laminated on the resin layer, and the third conductor layer is laminated on the adhesive layer of the first core layer.

8. A wiring board according to claim 1, wherein the plurality of core layers is formed such that each of the first and second core layers has a thickness of 100 μm or less.

9. A wiring board according to claim 8, further comprising:

a plurality of tapered via conductors formed in the second core layer such that the plurality of tapered via conductors is reducing in diameter in a same direction, wherein the via conductor structure formed in the first core layer comprises a plurality of tapered via conductors formed in the first core layer such that the plurality of tapered via conductors is reducing in diameter in a same direction.

10. A wiring board according to claim 2, wherein the first conductor layer is formed on an outer surface of the first core layer and the second conductor layer is formed on an outer surface of the second core layer such that the first and second conductor layers form outermost conductor layers in the plurality of conductor layers.

11. A wiring board according to claim 10, wherein the first core layer has a plurality of recess portions each opening outward such that the first conductive layer is formed at a bottom of each of the recess portions and has a thickness smaller than a depth of each of the recess portions.

12. A wiring board according to claim 3, wherein the electronic component comprises an IC chip.

13. A wiring board according to claim 10, further comprising:

a plurality of connection conductors formed in a plurality of through holes penetrating through the intermediate insulating layer such that each of the connection conductors has a tubular shape closed at one end and filled with resin derived from one of the first and second core layers, wherein the third conductor layer is formed between the first core layer and the intermediate insulating layer and the fourth conductor layer is formed between the second core layer and the intermediate insulating layer such that the plurality of connection conductors is connecting the third and fourth conductor layers.

14. A wiring board according to claim 13, wherein the each of the connection conductors has the tubular shape closed at one end on the third conductor layer and filled with resin derived from the second core layer, the first core layer comprises the multilayer structure comprising the resin layer and the adhesive layer laminated on the resin layer, and the third conductor layer is laminated on the adhesive layer of the first core layer.

15. A wiring board according to claim 2, wherein the plurality of core layers is formed such that each of the first and second core layers has a thickness of 100 μm or less.

16. A wiring board according to claim 3, wherein the first core layer has a plurality of recess portions each opening outward such that the first conductive layer is formed at a bottom of each of the recess portions and has a thickness smaller than a depth of each of the recess portions.

17. A wiring board according to claim 5, wherein the first core layer has a plurality of recess portions each opening outward such that the first conductive layer is formed at a bottom of each of the recess portions and has a thickness smaller than a depth of each of the recess portions.

18. A wiring board according to claim 1, further comprising:
   a plurality of connection conductors formed in a plurality of through holes penetrating through the intermediate insulating layer such that each of the connection conductors has a tubular shape closed at one end and filled with resin derived from one of the first and second core layers,
   wherein the third conductor layer is formed between the first core layer and the intermediate insulating layer and the fourth conductor layer is formed between the second core layer and the intermediate insulating layer such that the plurality of connection conductors is connecting the third and fourth conductor layers.

19. A wiring board according to claim 18, wherein the first core layer has a plurality of recess portions each opening outward such that the first conductive layer is formed at a bottom of each of the recess portions and has a thickness smaller than a depth of each of the recess portions.

20. A wiring board according to claim 19, wherein the each of the connection conductors has the tubular shape closed at one end on the third conductor layer and filled with resin derived from the second core layer, the first core layer comprises the multilayer structure comprising the resin layer and the adhesive layer laminated on the resin layer, and the third conductor layer is laminated on the adhesive layer of the first core layer.

\* \* \* \* \*